US006633476B1

(12) United States Patent
Allina

(10) Patent No.: US 6,633,476 B1
(45) Date of Patent: Oct. 14, 2003

(54) WATT-HOUR METER ADAPTERS WITH TVSS INDICATORS

(75) Inventor: Edward F. Allina, deceased, late of Lake Park, FL (US), Stanley F. Allina, Jr., legal representative

(73) Assignee: Meter Treater, Inc., Lake PArk, FL (US)

( * ) Notice: Subject to any disclaimer, the term of this patent is extended or adjusted under 35 U.S.C. 154(b) by 0 days.

(21) Appl. No.: 09/447,459

(22) Filed: Nov. 22, 1999

Related U.S. Application Data

(63) Continuation of application No. 08/519,917, filed on Aug. 28, 1995, now abandoned.

(51) Int. Cl.$^7$ ................................................ H02H 9/00
(52) U.S. Cl. ...................... 361/118; 361/56; 361/111; 361/127
(58) Field of Search .......................... 361/56, 119, 118, 361/127, 111

(56) References Cited

U.S. PATENT DOCUMENTS

| | | | |
|---|---|---|---|
| 2,606,232 A | | 8/1952 | St. John .................... 175/223 |
| 3,599,047 A | | 8/1971 | Magarian .................. 317/108 |
| 3,725,745 A | | 4/1973 | Zisa ........................ 317/104 |
| 3,914,657 A | | 10/1975 | Melanson .................. 317/61.5 |
| 4,023,071 A | * | 5/1977 | Fussell ..................... 361/56 |
| 4,089,032 A | | 5/1978 | Dell Orfano ............... 361/56 |
| 4,499,447 A | * | 2/1985 | Greenberg ................. 337/266 |
| 4,575,704 A | * | 3/1986 | Pezold ..................... 337/197 |
| 4,866,560 A | | 9/1989 | Allina ...................... 361/104 |
| 4,901,187 A | | 2/1990 | Allina ...................... 361/117 |
| 4,907,119 A | | 3/1990 | Allina ...................... 361/56 |

\* cited by examiner

*Primary Examiner*—Stephen W. Jackson
(74) *Attorney, Agent, or Firm*—Barry J. Schindler, Esq; Greenberg Traurig LLP

(57) ABSTRACT

The present invention relates to an apparatus comprising a watt-hour meter adapter housing having a substantially cylindrical outline with a translucent window into its interior, and having visible therewithin one or more lights connected between respective input power phases and ground. The invention also relates to a transient voltage surge suppression (TVSS) apparatus containing a TVSS means including varistors in a housing fitting in a plug-and-jack manner between a watt-hour meter and its customary socket in a utility box or panel, improved on-line TVSS status indication means comprising a translucent window in the housing, and an indicator light connected to show the status and visible through the window to an outside observer. The invention also includes an on-line TVSS status indication method for TVSS meter adapters fitting in a plug-and-jack manner between a watt-hour meter and its customary utility socket, comprising the steps of unplugging the watt-hour meter from its customary socket, plugging into that socket a TVSS meter adapter at least in part translucent and having located visibly in its interior at least one status light adapted to indicate the on-line status of a TVSS varistor means also located in the meter adapter housing, and plugging the watt-hour meter into the meter adapter.

17 Claims, 4 Drawing Sheets

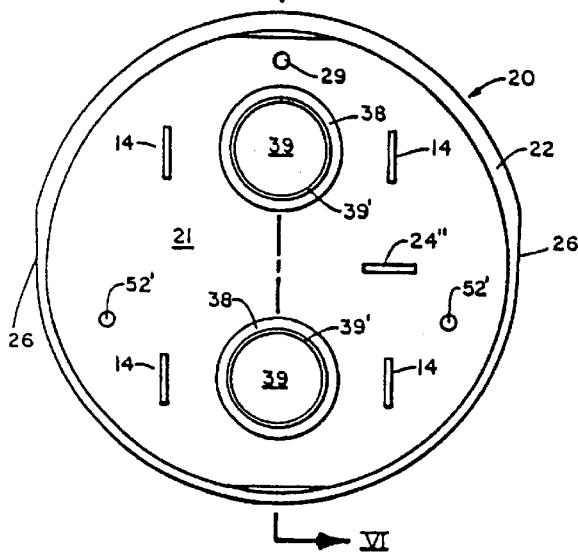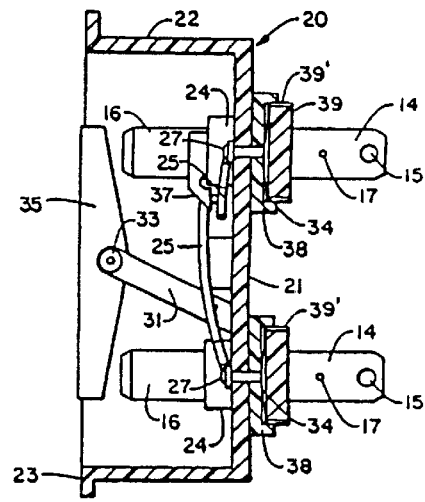

WATT-HOUR METER ADAPTERS WITH TVSS INDICATORS

CROSS-REFERENCE TO RELATED APPLICATIONS

This is a continuation of Application Ser. No. 08/519,917, filed Aug. 28, 1995 now abandoned.

STATEMENT REGARDING FEDERALLY SPONSORED RESEARCH OR DEVELOPMENT (Not Applicable)

TECHNICAL FIELD

This invention relates to transient voltage surge suppression (TVSS) between a conventional watt-hour meter location and a socket into which the meter's electrical contactor blades ordinarily plug, especially indicators of circuitry operability or ready condition.

BACKGROUND OF THE INVENTION

Electrical power that public or private utilities supply to users of electricity is susceptible to transient voltage variation attributable to lightning strikes and/or switching malfunctions. The desirability of protecting utility watt-hour meters and sensitive downstream electrical equipment from voltage surges is obvious. Customers traditionally bore the economic brunt of current surges, as light bulbs and motor windings failed ("burned out") from time to time as a result. However, that is becoming even less acceptable in an age of solid-state electronic devices, which often may be damaged worse by smaller surges than burned out appliance motors and radios in the past. Electrical utilities are now having to exercise more quality control over their product, to render it merchantable for modern-day uses—or be liable for not doing so.

The utility industry—slowly but surely—is realizing that the time has come to provide transient voltage surge suppression (TVSS), preferably in the vicinity of the usual watt-hour meter. Indeed, more forward-looking members of the utility industry are promoting surge protection, and the manufacturers of TVSS equipment are seeking suitable equipment to meet the need.

Conventional watt-hour meters are commonly interposed between an external power source and electrical equipment downstream so as to measure the amount of electrical energy or power utilized by the downstream equipment. Such meters have protruding bladelike contactors that plug into complementary socket jaws connected to power-line leads at a box or panel, as at a power customer's location. Plug-and-jack circuit-interruption devices for use between such an electric meter and premises where downstream electrical loads are powered from external power lines and metered by such meter include over-current circuit-interrupting means (breaker switches, with or without associated fuses), as suggested by Megarian in U.S. Pat. No. 3,599,047 and by St. John in U.S. Pat. No. 2,606,232. Such devices were contained within an interposed housing, which has come to be known simply as a "meter adapter." The meter is unplugged from its socket in the customary box or panel; the adapter is then plugged into the socket; and finally the meter is plugged into the adapter.

Solid-state over-voltage protective devices are known, whose resistance varies non-linearly under applied voltage, so that their electrical conduction is minimal at normal power voltages but disproportionately greater at higher surge voltages. Such a device, connected between a power line lead and an available ground lead, can clip off surge voltages and shunt surge currents safely to ground. A class of such devices is known by the name "varistor." Varistors connected to suppress transient surges have been proposed for use in watt-hour meters, as in Melanson U.S. Pat. No. 3,914,657 and Zisa U.S. Pat. No. 3,725,745, but such a locale for surge suppression has not been adopted to any appreciable extent. A more popular location for use of varistors in surge suppression has been in plug-in devices between electrical wall outlets and appliances to be operated by electricity drawn from such outlets. An example is found in Dell Orfano U.S. Pat. No. 4,089,032.

Despite (or perhaps because of) the teachings of such patents, interposition of a varistor or similar over-voltage protective means between a watt-hour meter and the meter socket was not known or practiced, until after the present inventor did so in the mid-1980s. He has pioneered increased surge capacity and safety of TVSS apparatus by heat-sinking component varistors, as in his U.S. Pat. No. 4,931,895 (soon to issue); by inserting temperature-responsive or "thermal" fuses or like cutoff devices to sense temperature and to disconnect the varistors from the power lines to preclude failure from excessive temperature rise (as in his U.S. Pat. No. 4,866,560); by stacking varistor disks in parallel circuit therein (as in his U.S. Pat. No. 4,901,187); and by including distributed-resistance fuse links—with and without thermal cutoff means and/or varistor stacking—between power line leads and such varistors (as in his U.S. Pat. No. 4,907,119).

In view of the extreme—and extremely short—voltage surges and the very large resulting surge currents, testing sites for apparatus of this general type have been rather limited (and testing costly) so that in most instances it is impracticable for users to test competing equipment or to verify (or disprove) operating specifications or technical claims of suppliers. Competing manufacturers may or may not have done such testing, but they have overwhelmingly adopted the meter adapter as the preferred means of carrying varistors connected in the vicinity of the watt-hour meter to provide TVSS.

As is true with any largely passive device, a simple method of ascertaining its operational condition is desirable, preferably one not requiring disassembly of the adapter and/or its contents. Known for this purpose in downstream individual TVSS plug-in devices, as in the above noted Dell orfano patent, are indicator lights actuated by the incoming power—and thereby showing a state of readiness when on (lighted). Such lights are useful, although they may give an erroneous "off-line" signal after failing from whatever cause, despite continued operability of the surge-suppression circuitry it self.

SUMMARY OF THE INVENTION

A primary object of the present invention is to enable transient voltage surge suppression (TVSS) circuitry installed in the vicinity of watt-hour meters to be checked for operational readiness by visual observation.

Another object of this invention is to provide an indication of circuit continuity or discontinuity visible from outside a watt-hour meter adapter containing TVSS circuitry and interposed between the meter itself and its customary socket in a wall box or panel.

A further object is to provide positive visual indication that a TVSS meter adapter is either operative or inoperative.

In general, the objects of the present invention are attained by shunting transient surges in externally supplied electrical power to ground by way of a plug-and-jack meter-to-socket adapter having either (or preferably both) one or more indicator lights and/or a translucent window in the adapter housing wall.

Other objects of the present invention, together with means and methods for attaining the various objects, will be apparent from the description and the accompanying diagrams of specific embodiments, which are presented by way of example rather than limitation.

SUMMARY OF THE DRAWINGS

FIG. 5 is a rear elevation of a housing adapter portion of the same means, shown disassembled from a cover plate portion thereof;

FIG. 6 is a vertical section through such adapter housing, taken at VI—VI on FIG. 5;

FIG. 7 is a front elevation of the cover plate member of such adapter means, whose rear elevation was shown in FIG. 4, here shown disassembled from the base of the housing member;

FIG. 8 is a horizontal section through such adapter cover plate, taken at VIII—VIII on FIG. 7; and FIG. 9 is a successively cut-away layered detail view of a portion of such apparatus including a cuplike holder;

DETAILED DESCRIPTION

Figure 1:
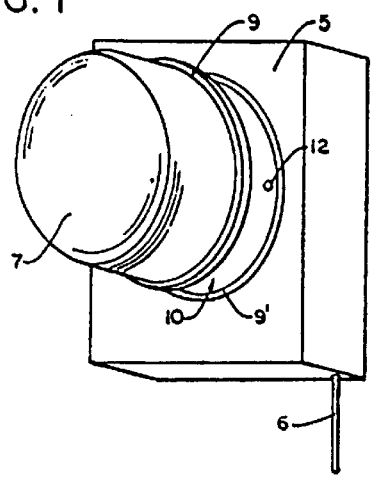
FIG. 1 is a perspective view of surge-protection adapter means of the present invention in normal use, between customary watt-hour meter means and usual meter-receiving means socket in a utility box.

In illustrated embodiments of the invention, like or analogous features are designated by the same or similar reference numerals, often with an added numerical prefix or alphabetical suffix and/or an added prime, whereas unlike parts are designated by reference numerals lacking such similarities. Such designation method helps to identify corresponding features, while tending to reduce repetition.

FIG. 1 shows, in perspective, generally rectangular electrical utility box 5, which has grounding cable or rod 6 extending downward from one bottom corner. Forward and leftmost of the box is meter 7 of conventional watt-hour type, with a dome-like transparent cover extending to the left (contents not shown here). As is customary, abutting components of the assembly are retained together by a split ring adapted to surround end flanges on the respective components. As is so well known as to require no illustration here, such type of retainer ring is flexible and has a slotted part and a laminar part adapted to protrude through the slot when the ring is put in place. An opening through the protruding laminar part receives a wire that is then surrounded by a lead seal or similar means to discourage or to reveal unauthorized disconnection or tampering with the assembly.

Figure 2:
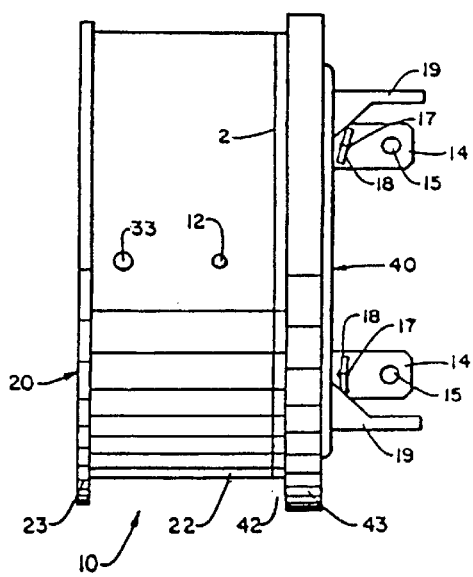
FIG. 2 is a right side elevation of the adapter means partially visible in FIG. 1, disassembled from other apparatus shown there.

FIG. 2 shows, in right side elevation, adapter means 10 of this invention disassembled from the meter and utility box of FIG. 1 and on an enlarged scale. The adapter comprises two principal members (joined together here along vertical junction line 2): open-ended cylindrical housing 20 at the left, and shallower cover plate 40 at the right. The housing member has sidewall 22, surrounded at its open (left) end by flange 23. Visible in the housing, just left of the separation line and midway from top to bottom, is condition indicator light 12 connected (as shown later) to indicate an operative or ready condition when lit and an unready or out-of-order condition when not lit. Further left is fastener 33, discussed further below.

Protruding to the right of the cover plate are plug terminals 14 of spade type (two of four are visible), each with opening 15 near its free end and with smaller opening 17 nearer the plate and with retaining cotter pin 18 therethrough. Above and below (partly surrounding and partly hidden beyond) the spade terminals are feet 19, one visible per connector, protruding a bit farther than the terminals. It will be apparent from later views that there are two pairs of such terminals; conventionally the upper pair are for power input to the meter, and the lower pair for power out to a customer's installation and electrically powered equipment downstream.

Figure 3:
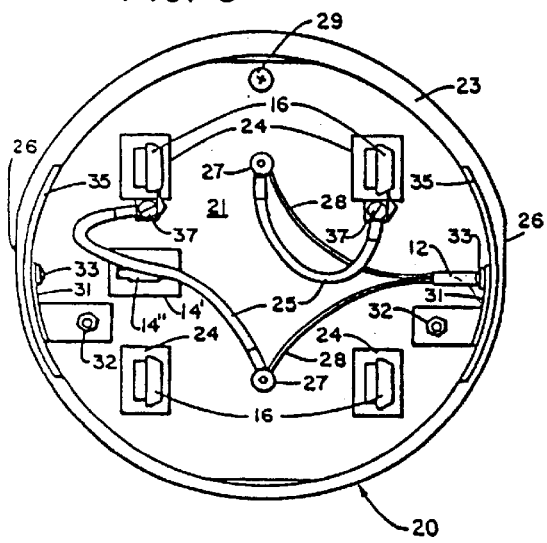
FIG. 3 is a front (meter) elevation of the same adapter means.

FIG. 3 shows in front elevation the open end of adapter housing 20 of adapter, which has base 21 closing one end of cylindrical sidewall 22. Generally circular edge flange 23 at the open end has a pair of flat portions 26 at its opposite sides. Four rectangular bosses 24 rise from the base of the housing, in a nearly square layout, each with one of the previously shown spade terminals inserted into and through a close-fitting vertical slot (unnumbered). Jaws 16 of the jack end of such terminals protrude toward the viewer from the tops of the bosses. Fifth boss 24' similar to the others but oriented with slot 24" therein (horizontal instead of vertical) is located between left-upper and lower bosses 24—for other uses.

Fasteners shown in FIG. 3 and subsequent views are illustrative rather than limitative. Usually (but not always) the same reference numeral denotes all parts of any given fastener, whether alike or different, as at opposite ends. Pair of fuse links 25 connect between pair of fasteners 37 at the top pair of terminals to pair of fasteners 27 located laterally midway between the top and bottom pairs of bosses, respectively. Condition light 12 (partly hidden in a right sidewall opening) has pair 28 of leads also extending to fasteners 27. Shown between the light and the viewer is one of pair of ground straps 31, secured to fasteners 32 (one each) in the base and also to fasteners 33 (one each) in the sidewall of the housing. The respective straps are attached by the last mentioned fasteners to grounding collars 35, extending along minor lengths of the edge of the housing sidewall. Above upper fastener 27 is fastener 29 to help retain cover plate 40 onto the outside of the housing base.

Figure 4:
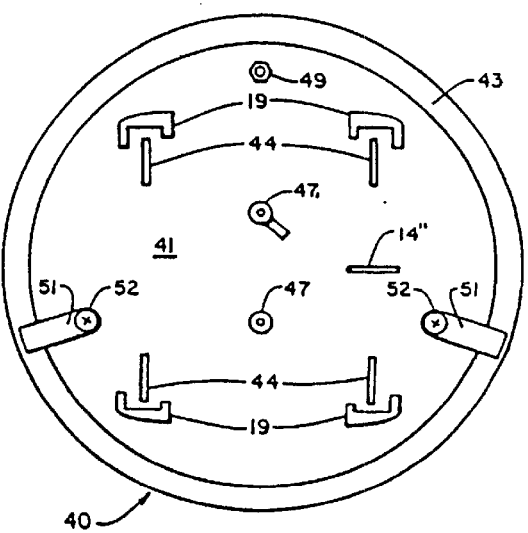
FIG. 4 is a rear (socket) elevation of the same adapter means.

FIG. 4 shows adapter means 10 in rear elevation, notably cover plate 40 and specifically the outside face of its plate 41 and edge of its surrounding flange 43. Shown symmetrically arranged in the same pattern as jaws of the terminals in FIG. 3 are spade ends 14 thereof. Partly surrounding the outer edges of the terminals are feet 19, here seen end-on. On the vertical midline (not marked) are pair of fasteners 47, 47' located a short distance below and above the horizontal midline (also not marked). Auxiliary pigtail ground connector 42 is part of the upper fastener. Above it is opposite end 49 of fastener 29 extending from the housing base (see FIG. 3). Slanting downward at both the right and left sides, from the ends of screw fasteners 52 (one each) in the plate near the edge of the flange, are pair of grounding strips 51 partly overlying that edge.

FIG. 5 shows, in rear elevation, housing base 21 of adapter means 10, whose front elevation appeared in FIG. 3. Upper and lower bores 29 appear as before. Spade terminals 14 protrude toward the viewer through corresponding slots (not visible) in the rectangular array shown previously. Unused horizontal terminal slot 24" also appears in this view.

Also visible in FIG. 5, midway between the respective upper and lower pairs of terminals, are pair of shallow cup-shaped nonconductive holders 38 for disk-shaped varistors 39, each one with non-conductive collar 39' surrounding it. Right and left flats 26 on housing flange 23 appear as before. A vertical section line is superimposed to indicate the next view.

FIG. 6 shows a vertical section through the housing member of the adapter means, at VI—VI on FIG. 5, corresponding to a leftward looking vertical section of the housing member of the adapter shown from the front in FIG. 3. Partial collar 35 is seen, in more detail than previously, along part of the edge of flange 23 and sidewall 22 and connected by fastener 33 to grounding strap 31, which terminates along the housing base as shown further in FIG. 3.

One fuse link 25 is connected between fastener 37 at the upper terminal to fastener 27 located nearer the viewer than the lower terminal and surrounding boss. The other fuse link is shown (fragmentarily) connected to the corresponding fastener ahead of the upper terminal boss. The other end of each such fastener is suitably attached to one of a pair of conductive lamina 34, circular in outline, contiguous with one face of one of varistors 39, each in adjacent cup-shaped holder 38. The laminar cross-section shows a recessed central part, surrounding the head of the fastener, and a flatter annular part therearound and in actual contact with the conductive varistor face. Of course, the varistors and holders are nearer the viewer than spade terminals 14 shown extending to the right from locations behind them. Contactors (one each) for the opposite face of each varistor are carried by the cover member, as shown in the next pair of views.

FIG. 7 shows, in front elevation, cover plate 40, whose rear elevation was shown in FIG. 4. Bore 49 near the top center, just below the inner edge of flange 43, is surrounded by boss 48. Slots 44 for spade terminals 14 (not present in this view) are visible as before. The most prominent feature here is electrically conductive laminar cruciform member 50, with wide body portion extending from just below boss 48 to near the bottom inside edge of flange 43, and narrower arm portions extending therefrom. Central rectangular part 55 of the body portion adjoins upper and lower body parts 56 and 57, each of which rises toward the viewer and is sufficiently springy to provide excellent electrical contact with the underlying varistors when the cover plate is assembled to the adapter housing base. Pair of integrally formed arms extend outward and slant downward from the opposite sides of the central part of the body member. Each arm has terminal part 54, overlying boss 58 and secured by screw fastener 52 through an opening therein, interconnected to the body by inclined intermediate part 53 (separately designated here because of planar differences visible in the next view).

FIG. 8 shows cover plate 40 sectioned horizontally and viewed downward, as taken at VIII—VIII in FIG. 7. Bosses 58 (through which screw fasteners 52 pass) underlie respective end portions 54 of cruciform member 50, raising them out of the plane of the central part of body portion 55 thereof, which is secured against the inner face of the cover plate by a pair of fasteners (see FIG. 4). Outer end of only the lower one of such conducting ends can be seen here. Intermediate portions 53 of the arms slant upward from junction with the body to junction with respective end portions 54 of member 50. Lower part 57 of the body portion of the cruciform member shown in FIG. 7 is visible rising from the plane of that part so secured.

FIG. 9 shows, on an enlarged scale and successively cut away, a portion of the apparatus of this invention shown in somewhat less detail in prior views. Shown closest to the viewer is part of the body portion of electrically conductive member 50, cut away to show some of the underlying components, including next underneath and in contact with it a face of varistor 39, with insulating collar 39'. circumferentially surrounding the varistor is upturned edge 38' of non-conductive cuplike holder 38, which does not reach overlying conductive member 50. The varistor and its surrounding collar are cut away to reveal conductive lamina 34, which is in contact with the underlying opposite face of the varistor, and incidentally to show more of the base of the cuplike holder as well. This view is included because of the operational importance of the electrical circuitry represented by the visible components, whose functioning is considered in some detail below, where it is noted that member 50 is not only an excellent conductor of electricity but also of heat.

Operation of the apparatus of this invention will be readily understood. In the event of an electrical transient that exceeds the usual power voltage sufficiently to pose an equipment hazard, i.e., a "surge", it appears across the power input terminals (the top pair) and is conducted by the fuse links to the varistors. In a very short time, varistor conduction occurs and bleeds the surge harmlessly off to ground via the intervening conductive elements. It will be understood that a path is provided to the grounding rod or cable via cooperating conductors (not shown) with which contact is made upon assembling the adapter means to the electrical utility box (into whose socket the meter usually is plugged, in the absence of the adapter means of this invention).

Perhaps not so apparent is the fact that the current flow in a lightning-induced surge, even for only a few microseconds to a millisecond or so, may result in a current density of hundreds or even thousands of amperes per square centimeter. Despite the low resistance of the path followed within the adapter, the resulting heat to be dissipated may be appreciable. The ground side conductor (part of member 50) functions not only to provide considerable current-carrying capacity as needed but also an auxiliary heat sink and thereby tends to preclude possible flashover, shorting, or other damage to the varistors. This enables the adapter—and the meter protected by it—to withstand repeated lightning surges or similar intermittent disturbances without any failure or damage to the varistors or other parts.

The heat sink conveniently is made up of a metal having high electrical conductivity, thermal conductivity, and heat capacity. copper is preferred, but aluminum (which will occupy several times as much space as an equivalent mass of copper) is also suitable. A couple grams of either will take up several joules (about a dozen calories) of heat energy for each degree of rise in temperature. If the higher cost is acceptable, silver—not to mention gold—is an excellent choice.

Surge-generated heat collected in large part by the heat sink is subsequently conveyed away—usually mostly by conduction, partly by convection, and even less by radiation—to the environment. A multiplicity of such surges can be accommodated while increasing the temperature of a suitable heat sink only relatively few degrees, whereas collection of the equivalent amount of heat energy by the varistors or by sensitive meter parts risks adverse effects upon them or their functioning.

In the event of a more sustained surge, as from some fault in power generation or transmission, resultant melting of one of the fuse links soon disconnects the power from the indicator light, a gas-filled (e.g., neon) glow lamp or a light-emitting diode, for example. Observation that the light is out prompts inspection and temporary replacement of the unit for inspection and testing, to be followed by whatever maintenance may prove necessary.

The varistors themselves, which comprise chiefly sintered metal compositions, such as zinc oxide or silicon carbide, together with lesser amounts of other important materials, are quite rugged and can stand a good deal of electrical abuse. They are articles of commerce and can be obtained in a wide range of voltage and current capacities through electrical equipment manufacturers or dealers.

The other components of the adapter apparatus of this invention are also readily available in ordinary trade channels. The housing and cover members may be adapted from standard articles or may be redesigned specifically for this purpose. They are composed of common non-conductive plastic materials, with or without reinforcing additives. Glass-fiber reinforced polyester and ABS are examples of the many suitable compositions available.

Indicator lights are conveniently light-emitting diodes (LEDs), which are readily available in red or other colors.

Advantages of using the surge-protective adapter apparatus of this invention have been mentioned above, and others will be readily apparent. A watt-hour meter already in use can be protected simply by unplugging it and plugging the adapter in its place, and then plugging the meter into the adapter. Existing meter designs do not have to be redesigned at considerable expense and possible delay in availability to incorporate varistors or equivalent protective means because the adapter renders such redesign unnecessary.

Electrical power customers benefit because the protection also protects their appliances, computers, radio or television receivers, and other sensitive loads from the same surges. Such protection is as worthwhile for their equipment as it is for the power company's meters, so the power company benefits both directly and indirectly.

Figure 10:
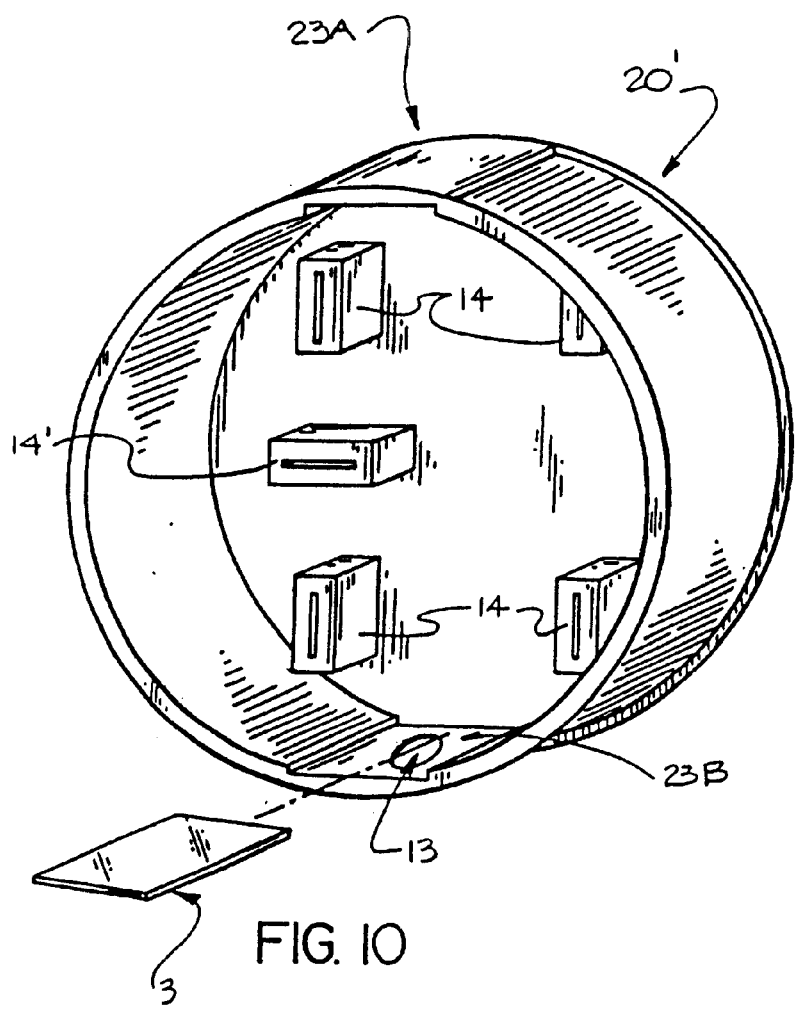
FIG. 10 is an exploded perspective view of a modified meter adapter housing of this invention.

FIG. 10 shows, in an exploded perspective view, embodiment 20' of meter adapter housing, looking into it from the meter location. The connector jaws and other fittings of the previous embodiment are omitted as unnecessary to this illustration. Whereas that previous embodiment (20) was smoothly cylindrical, this embodiment (20') has diametrically opposed portions 23A and 23B—at the top and bottom, respectively—offset outward and flattened parallel to one another. Bottom flat 23B has opening 13 therethrough. As indicated, window piece 3, which is translucent, fits against the inside (top) surface of this bottom flat and is bonded in place there (hatched).

Figure 11:
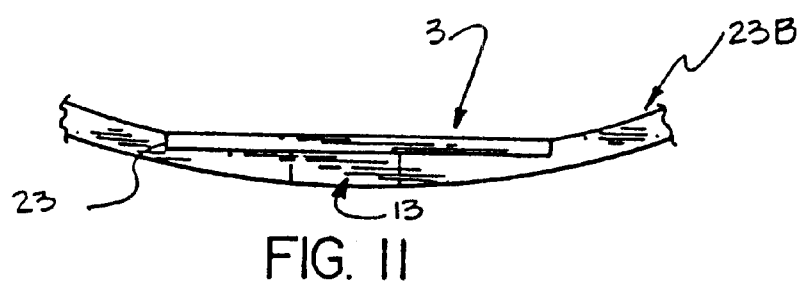
FIG. 11 is a fragmentary transverse sectional elevation of the adapter housing, on an enlarged scale, taken at XI—XI of FIG. 10.

FIG. 11 shows fragmentarily, on an enlarged scale, a transverse sectional elevation of bottom flat segmental portion 23B of the adapter housing of FIG. 10, with translucent window piece 3 in place covering opening 13 in that portion of the housing. Layer 23 of adhesive or equivalent means bonds the window piece to the inside surface of the flat segmental housing portion.

Figure 12:
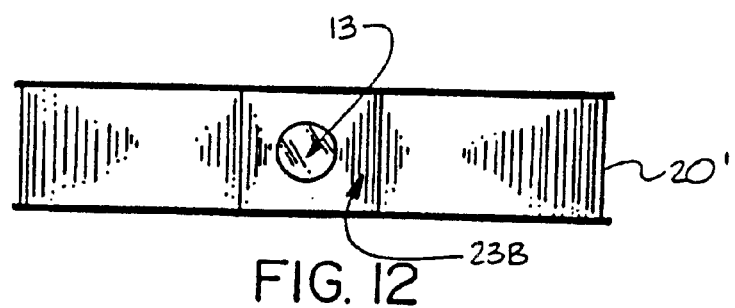
FIG. 12 is a fragmentary transverse sectional plan (looking up) of the same adapter housing, taken at XII—XII of FIG. 10.

FIG. 12 shows fragmentarily the under surface of bottom flat portion 23B of that adapter housing (20').

Figure 13:
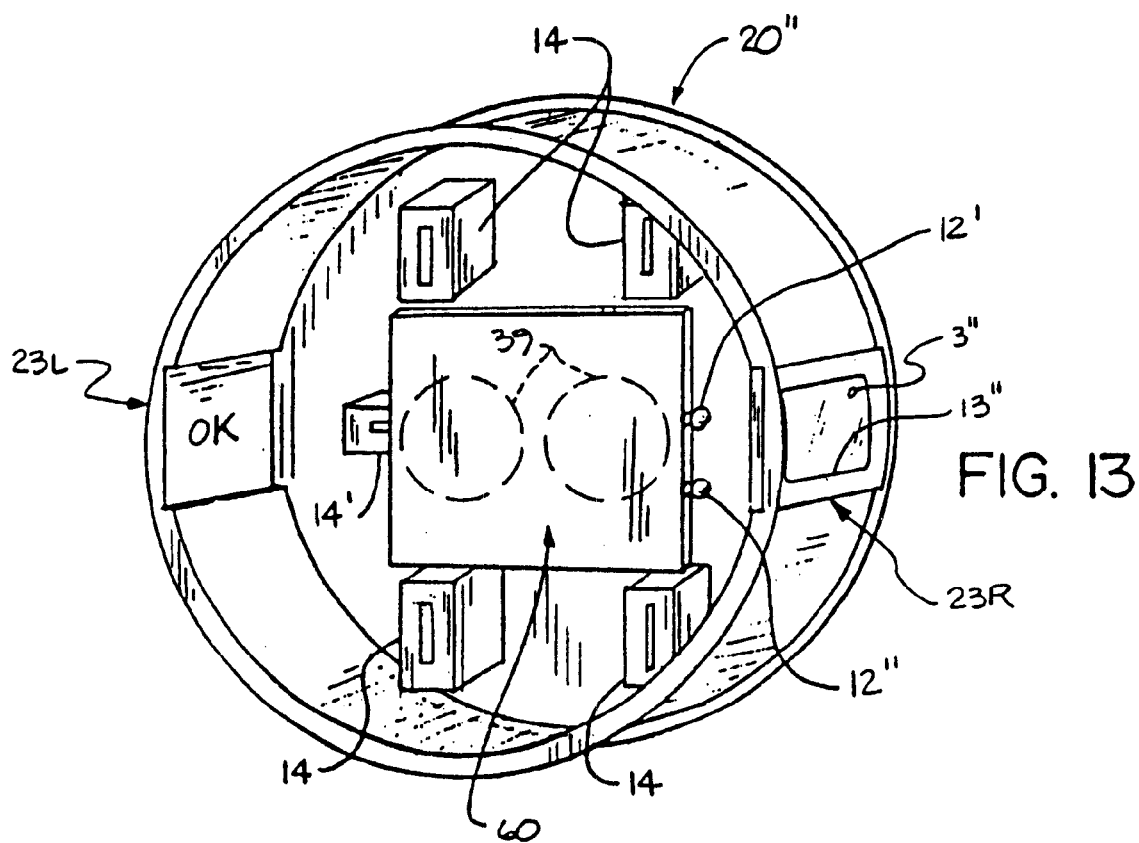
FIG. 13 is a perspective view of another embodiment of this invention with visual indicator means in a meter adapter housing.

FIG. 13 shows in perspective view another embodiment 20" of the meter adapter housing of this invention including diverse indicator means of both prior embodiments.

Figure 14:
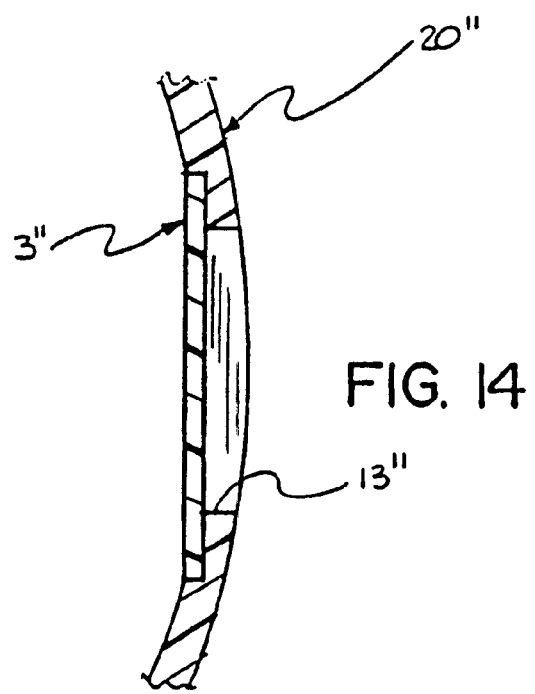
FIG. 14 is a fragmentary sectional view through a window portion of the latter adapter housing embodiment.

FIG. 14 shows, in sectional elevation, window piece 3" at the right inside surface, adjoining housing opening 13"—indicated by dashed lines as generally rectangular and larger than previously.

In this last embodiment, offset flat adapter housing portions 23L and 23R have been located at the sides (rather than at top and bottom). Mounted in the housing, affixed as by fastener 61 to fifth boss 14', is oblong TVSS circuit board 60, with its corners close to the other bosses. Extending just to the right edge of the circuit board are a pair of indicator lights 12', 12" visible through the nearby window, and connected (not shown) between respective phase lines from the power source via the bladelike contactors previously shown at the adapter housing right and the left sides, respectively.

FIG. 13 also shows flat 23L at the opposite inside wall portion of the meter adapter housing of this embodiment, viewed from the in side. That flat portion carries an OK marking. That (or any other marking thereon) indicates to an observer looking at such surface through the window in the opposite side that the circuitry has not gotten hot enough to obscure it, as by depositing a smoke layer on the window inside surface. A flashlight or similar illumination means can be helpful in making such an observation. Such a passive indicator means or method is independent of active indicators, such as the illustrated indicator lights—which require electrical power.

One or more such lights, along with the window, can be deemed a "belt and suspenders" approach to ensuring visually, as to an inspector outside, that the surge-suppression circuitry is in an operable or ready condition. The lights indicate that power is present and the variable-resistance surge path to ground is intact, whereas the window indicates the lack of any smoking circuitry failure. Similar indicators are disclosed in my U.S. Pat. Nos. 4,907,119 and 4,931,895, and applications Ser. Nos. 208,206 and 488,677 filed Apr. 22, 1988 and Mar. 5, 1990, respectively, (incorporated herein by reference).

Preferred embodiments and variants have been suggested for this invention. Other modifications may be made, as by adding, combining, deleting, or subdividing compositions, parts, or steps, while retaining all or some of the advantages and benefits of the present invention—which itself is defined in the following claims.

What is claimed is:

1. An apparatus comprising a watt hour meter adapter housing having a substantially cylindrical outline with a translucent window into its interior and having visible therewithin at least one light connected between respective input power phases and ground, wherein the at least one light is activated when the apparatus is operating, the light extinguishing upon failure of the apparatus.

2. The apparatus according to claim 1, wherein said housing further comprises transient voltage surge suppression structure, said surge suppression structure having at least one varistor connected between said respective input power phases and ground, and said at least one light connected for each input power phase.

3. The apparatus according to claim 2, wherein said at least one light is on a circuit board with said surge suppression structure.

4. The apparatus according to claim 1, wherein said housing has a plurality of translucent windows for visibility into its interior.

5. The apparatus according to claim 4, wherein said translucent windows are substantially diametrically opposed in said housing.

6. A transient voltage surge suppression apparatus, comprising:
   transient voltage surge suppression structure having varistors in a housing fitting in a plug-and-jack manner between a watt-hour meter and at least one from the group consisting of a socket in a utility box and socket in a panel;
   an on-line transient voltage surge suppression status indicator having a translucent window in said housing; and
   an indicator light connected to show said status and visible through said window to an outside observer, wherein the indicator is activated when the apparatus is operating, the light extinguishing upon failure of the apparatus.

7. The apparatus according to claim 6, including individual transient voltage surge suppression indicator lights located inside said housing for respective input phase lines, said lights being visible through said window to an outside observer.

8. The apparatus according to claim 6, including a plurality of said windows through which said indicator lights are visible to an outside observer.

9. A transient voltage surge suppression status indication method for transient voltage surge suppression adapters fitting in a plug-and-jack manner between a watt-hour meter and an electrical socket, comprising the steps of:
   unplugging the watt-hour meter from the socket;
   plugging into that socket a transient voltage surge suppression meter adapter at least in part translucent and having located visibly in its interior at least one status light adapted to indicate an on-line status of a transient voltage surge suppression varistor structure located in the meter adapter housing; and
   plugging the watt-hour meter into the meter adapter.

10. The method according to claim 9, further comprising the steps of previously connecting individual on-line status indicator lights in series between respective input power phase leads and ground through respective transient voltage surge suppression varistor structure, and providing in the meter adapter at least one translucent window through which the on-line status lights are visible to an outside observer looking through the window.

11. The method according to claim 9, further comprising the step of providing a plurality of windows in the meter adapter, thereby giving an outside observer a choice of vantage point from which to observe the on-line status lights.

12. The method according to claim 11, further comprising the step of providing windows substantially diametrically opposite one another in the meter adapter.

13. An on-line status indication method for transient voltage surge suppression circuitry in a meter adapter housing to be plugged between a watt-hour meter and an electrical socket having a plurality of power phase lines available at the socket, comprising the steps of:
   providing inside the housing a corresponding plurality of transient voltage surge suppression on-line visual indicator means adapted to light in confirmation of transient voltage surge suppression on-line status for the respective phase lines; and
   providing in the housing a plurality of translucent windows.

14. The method according to claim 13, further comprising the step of determining the transient voltage surge suppression on-line status by looking through a window and observing if the visual indicator means is lighted.

15. The apparatus according to claim 1, wherein said at least one light is positioned distal to said window.

16. The apparatus according to claim 1, wherein said at least one light is mounted to mounting structure within said housing, said mounting structure located distal to said window.

17. The apparatus according to claim 1, wherein said at least one light is supported by support structure within said housing, said mounting structure located distal to said window.

* * * * *